United States Patent
Goh et al.

(10) Patent No.: US 7,361,995 B2
(45) Date of Patent: Apr. 22, 2008

(54) MOLDED HIGH DENSITY ELECTRONIC PACKAGING STRUCTURE FOR HIGH PERFORMANCE APPLICATIONS

(75) Inventors: Kim Yong Goh, Singapore (SG); Rahul Kapoor, Singapore (SG); Anthony Yi-Sheng Sun, Singapore (SG); Desmond Yok Rue Chong, Singapore (SG); Lan H. Hoang, Fremont, CA (US)

(73) Assignees: Xilinx, Inc., San Jose, CA (US); UTAC - United Test and Assembly Test Center Ltd., Singapore (SG)

( * ) Notice: Subject to any disclaimer, the term of this patent is extended or adjusted under 35 U.S.C. 154(b) by 90 days.

(21) Appl. No.: 10/543,301

(22) PCT Filed: Feb. 3, 2004

(86) PCT No.: PCT/US2004/002985
§ 371 (c)(1),
(2), (4) Date: Jul. 26, 2005

(87) PCT Pub. No.: WO2004/070790
PCT Pub. Date: Aug. 19, 2004

(65) Prior Publication Data
US 2006/0087033 A1     Apr. 27, 2006

Related U.S. Application Data

(60) Provisional application No. 60/444,205, filed on Feb. 3, 2003.

(51) Int. Cl.
*H01L 29/40* (2006.01)

(52) U.S. Cl. .................. 257/778; 257/780
(58) Field of Classification Search ............. 257/734, 257/737, 738, 780, 701, 720, 772; 438/800
See application file for complete search history.

(56) References Cited

U.S. PATENT DOCUMENTS

| | | | |
|---|---|---|---|
| 5,605,863 A * | 2/1997 | Wills et al. | 438/122 |
| 5,702,426 A * | 12/1997 | Pons et al. | 607/27 |
| 5,909,056 A | 6/1999 | Mertol | |
| 6,190,945 B1 * | 2/2001 | Akram | 438/122 |
| 6,232,152 B1 * | 5/2001 | DiStefano et al. | 438/124 |
| 6,359,335 B1 | 3/2002 | Distefano et al. | |
| 6,444,498 B1 | 9/2002 | Huang et al. | |
| 2001/0032933 A1 * | 10/2001 | Thomson et al. | 250/370.01 |
| 2001/0040300 A1 * | 11/2001 | Huang et al. | 257/787 |
| 2002/0008316 A1 * | 1/2002 | Miyazaki | 257/701 |
| 2002/0074669 A1 | 6/2002 | Watanabe et al. | |
| 2002/0185717 A1 * | 12/2002 | Eghan et al. | 257/678 |
| 2003/0148557 A1 * | 8/2003 | Lim et al. | 438/127 |

* cited by examiner

*Primary Examiner*—Jerome Jackson
*Assistant Examiner*—Jami M Valentine
(74) *Attorney, Agent, or Firm*—Sughrue Mion, PLLC

(57) ABSTRACT

A thermally enhanced ball grid array package is disclosed. The package includes a base layer element and a flip chip die mounted on the base layer element. The die has a first surface electrically coupled to the base layer element, a second surface opposite to the first surface, and lateral sides. A molding compound encapsulates the base layer element and the lateral sides of the die. A surface is formed of the second surface of the die and an upper surface of the molding compound. A material is disposed on the surface, and a heat spreader is mounted on the material.

24 Claims, 6 Drawing Sheets

MOLDED HIGH DENSITY ELECTRONIC PACKAGING STRUCTURE FOR HIGH PERFORMANCE APPLICATIONS

This application claims the benefit of the co-pending U.S. Provisional Application No. 60/444,205, filed on Feb. 3, 2003, and incorporated herein by reference.

BACKGROUND OF THE INVENTION

1. Field of the Invention

The present invention generally relates to the field of semiconductors and, in particular, is directed to a flip chip ball grid array package and a method of making the same that minimizes cost and manufacture time while enhancing heat-dissipating efficiency.

2. Discussion of Related Art

Semiconductors are materials that have characteristics of insulators and conductors. In today's technology, semiconductor materials have become extremely important as the basis for transistors, diodes, and other solid-state devices. The most commonly used semiconductor materials include germanium and silicon, but selenium and copper oxide, as well as other materials, also are used. When properly made, semiconductors will conduct electricity in one direction better than they will in the other direction. A semiconductor chip is a highly miniaturized integrated electronic circuit. In its purest form, a semiconductor chip is a collection of transistors. The circuitry of the chip is provided in a layered form on a semiconductor material.

Wire bond, when applied to semiconductor chip devices, completes a wire connection providing electrical continuity between the semiconductor chip and a terminal. The constituents of an electrical connection may include any one or more of a fine metal wire, metal bonding surfaces (like a die pad), metallurgical interfaces underneath a bonded wire deformation, underlying insulating layer (if present), and a base layer element. Wire bonding is a method used to attach very fine metal wire to semiconductor components in order to interconnect the components with each other or with package leads. One problem encountered with wire bonds is the parasitic inductance that arises, which is based on the size and length of the wire carrying electricity to the components. Also, wire bonds are fragile and have limited current carrying capability.

A flip chip is a leadless monolithic structure, containing circuit elements, which is designed to electrically and mechanically connect to a hybrid circuit. Such connection may be, but is not limited to, a structure such as a number of bumps, which are covered with a conductive bonding agent and are formed on its front-side planar face. In one conventional flip chip mounting technique for integrated circuits, a semiconductor chip is placed front face-down on a mounting base layer element and is connected to wire patterns on the base layer element using the bumps as electrical contacts and the conductive bonding agent as an adhesive. Because the flip chip mounting technique can bond a chip to a base layer element over a much shorter distance than wire bonding, the effect of parasitic inductance can be reduced. Also, the thicker bumps are less fragile than wires and can conduct greater amounts of current. Some flip chips can thus be mounted onto a circuit base layer element with limited or even no need for wire bonding. Flip-chip mounting is thus drawing increasing interest as a mounting technique for high-frequency integrated circuits.

Emerging electronic product applications are creating a set of challenges for the integrated circuit (IC) packaging industry. With ever increasing requirements for greater functionality and lower system costs, a primary requirement for new packaging technology is low cost. Because of these cost requirements, the thermal, electrical, mechanical, and assembly characteristics of each IC package design must be optimally tailored, and not overdesigned. Characterization equipment and design tools for analyzing electrical, mechanical, and thermal performance are being used to enhance the package design, so that development cycle times are reduced, and cost targets are met. One such enhanced package design is the ball grid array (BGA), which can be used in flip chip applications.

BGA packages present numerous benefits previously unobtainable with the use of single packaging technology. BGAs provide higher pin counts over a smaller area and a robust "ball" structure that integrates seamlessly into the manufacturing process. Plastic Ball Grid Array (PBGA) packages are designed to provide low inductance, improved thermal operation and enhanced surface mount technology (SMT) capability. PBGA packages are ideal for use with specific integrated circuits (ASICs), microprocessors, controllers, gate arrays, memory, digital signal processors (DSPs) and personal computer (PC) chip set applications. PBGA packages are often coupled with flip chip designs.

The BGA package format presents challenges not encountered in the modeling of standard leaded packages due to the existence of more complex heat flow paths. For example, the conventional PBGA designs are not able to deliver the thermal performance that is possible with other package designs. Accordingly, the inability to remove heat generated during chip operation in conventional flip chip PBGA design has presented certain electrical and reliability disadvantages, as heat can often only be removed through the base layer element. A newer, enhanced BGA packaging technology is capable of providing a light-weight and very low profile high I/O packaging solution capable of superior thermal performance. In particular, high thermal performance is achieved through the use of a heat-spreader, which preferably is made of copper or AlSiC and is directly attached to the back face of the IC chip. Typically, the heat spreader must have a size larger than the surface of the die, in order to effectively distribute and dissipate heat generated by the die.

Examples of such conventional spreader-based flip chip PBGA design are illustrated in FIGS. 1A and 1B. The conventional high-performance flip chip plastic ball grid array package 100A, as illustrated in FIG. 1A, includes an organic base layer element 102. The base layer element 102 has a plurality of (preferably eutectic) solder balls 101 provided on the first surface 102$a$ of the base layer element 102 for mounting to a circuit (not shown), and a flip chip die 103 mounted on the second surface 102$b$ of the base layer element 102. The flip chip die 103 has conventional flip chip solder bumps 104 arrayed on the first surface 103$a$ of the flip chip die 103 for coupling to conductive patterning (not shown) formed on the base layer element. An underfill epoxy 114 is applied about the sides 103$c$ of the flip chip die 103, in order to secure the die to the base layer element 102 and to prevent damage to the solder bumps 104. The package 100A utilizes a metallic heat spreader 106 comprising two pieces, a first planar piece 106$a$, which is coupled by a thermal grease 109 to the second surface 103$b$ of the flip chip die 103, and a second ring-shaped piece 106$b$, which serves to add strength to the structure. The second ring-shaped piece 106$b$ is positioned around the flip chip die 103 in order to increase rigidity of the flip chip packaging assembly so that the first planar piece 106$a$ of the metallic heat spreader 106 is adequately supported and so that the base layer element 102 will not warp during the various fabrication processes or during operation. An epoxy material 107, which ordinarily is non-conductive, is used to secure the second ring shaped piece 106b of the metallic heat spreader 106 to the base layer element 102 and to the first planar piece 106a of the metallic heat spreader 106. A disadvantage in the production of this design is that separate steps for application of the thermal grease 109 and epoxy material 107 are required, thus adding to the cost and potentially reducing the yield. U.S. Pat. No. 5,949,137 to Domadia et al. discloses a flip chip packaging assembly with a second ring-shaped piece 106b such as described.

The heat spreader may also be designed as a one-piece structure 108 for a chip package 100B, as illustrated in FIG. 1B. In the two-piece embodiment, the second ring shaped piece 106b is first secured to the base layer element 102, and then the first planar piece 106a is secured to the package. In the one-piece embodiment of FIG. 1B, a one piece heat spreader 108 having an integral structure comprising a planar part 108a and a peripheral supporting part 108b is affixed over the flip chip die 103. As in the embodiment of FIG. 1A, a thermal grease 109, which facilitates heat transfer, is applied between the planar part 108a of the one piece metallic heat spreader 108 and the second surface 103b of the flip chip die 103. An epoxy material 107 is applied to bond the peripheral supporting part 108b of the one piece metallic heat spreader 108 to the second surface 102b of the base layer element 102. Again, a disadvantage is that separate steps for application of the thermal grease 109 and epoxy material 107 are required.

In both prior art designs, as illustrated in FIGS. 1A and 1B, a space 115 is left between the second ring shaped piece 106b of the metallic heat spreader 106 or the peripheral supporting part 108b of the metallic heat spreader 108 and the underfill epoxy 114. The space is bounded by the second surface 102b of the base layer element 102 and the underside of the first planar piece 106a of the metallic heat spreader 106 or the planar part 108a of the metallic heat spreader 108, that overhangs the flip chip die 103.

Due to the structure of the conventional heat spreader designs illustrated in FIGS. 1A and 1B, the cost of fabrication is very high. For the two-piece design of FIG. 1A, two separate toolings are needed and at least two assembly steps are required to attach the metallic heat spreader 106 over the flip chip die 103. The second ring shaped piece 106b of the heat spreader 106 and the supporting part 108b of the heat spreader 108 reduce the area available for the mounting of semiconductor dies and/or other components within. The one-piece design of FIG. 1B requires special processes such as special powder injection molding or precision machining to produce the complex one-piece design.

Tight process control requirements are another disadvantage of the conventional BGA package with a metallic heat spreader. For example, with regard to the two-piece design of FIG. 1A, in order to mechanically bond the ring shaped piece 106b of the heat spreader 106 to the packaging base layer element 102, a thin bond layer of epoxy material 107 is applied between the ring shaped piece 106b and the packaging base layer element 102, and between the ring shaped piece 106b and the first planar piece 106a of the metallic heat spreader 106. A thermal grease 109 is applied between the flip chip die 103 and the planar piece 106a. Tight process control is required when dispensing the epoxy material 107 or thermal grease 109 during the assembly of the conventional package. This is because the die thickness and the heat spreader thickness are fixed, and a low profile is desired by design. Therefore the epoxy material 107 must be adequate to secure the heat spreader firmly to the flip chip die 103 and base layer element 102, yet not so thick as to increase the profile.

Accordingly, there is a need for an improved, economical flip chip package design that can overcome the above mentioned disadvantages with a low-cost heat spreader design that is easy to assemble and that provides comparable thermal characteristics.

SUMMARY OF THE INVENTION

A BGA package according to the first embodiment of the present invention comprises a base layer element and a flip chip die mounted on the base layer element. The flip chip die comprises a first surface electrically coupled to the base layer element, a second surface opposite to the first surface, and a plurality of lateral sides. The package also comprises a molding compound encapsulating the base layer element and the lateral sides of the die whereby a substantially planar surface is formed comprising the second surface of the die and an upper surface of the molding compound.

According to one aspect of the first embodiment, the molding compound forms lateral edges tapering upward and inward form the base layer element to the substantially planar surface.

According to another aspect of the first embodiment, the package further comprises a material disposed on the substantially planar surface and a one-piece heat spreader mounted on the material.

According to another aspect of the first embodiment, the package further comprises a supplemental component mounted on the base layer element. According to this aspect, the molding compound further encapsulates the supplemental component.

According to another aspect of the first embodiment, the package further comprises at least one additional flip chip die mounted on the base layer element.

According to another aspect of the first embodiment, the package further comprises at least one wire bonded die mounted on the base layer element and a plurality of wires electrically joining a second surface of the wire bonded die to the base layer element. The package can further comprise a heat transfer element mounted on the wire bonded die.

According to a second exemplary embodiment of the present invention, a BGA package comprises a base layer element and a wire bonded die mounted in a die down configuration on the base layer element. The wire bonded die comprises a first surface mounted on the base layer element, a second surface, and a wire bond electrically coupling the first surface of the wire bonded die to the base layer element. The package also comprises a molding compound encapsulating the base layer element and wire bonded die. A substantially planar surface is formed comprising the second surface of the wire bonded die and an upper surface of the molding compound.

According to an aspect of the second exemplary embodiment, a material is disposed on the substantially planar surface and a one-piece heat spreader is mounted on the material.

According to a third exemplary embodiment of the present invention, a method of assembling a BGA package comprises providing a base layer element and at least one flip chip die. The flip chip die comprises a first surface, a second surface, and a plurality of lateral sides. The method also comprises mounting the flip chip die on the base layer element, whereby the first surface of the die is electrically conductively joined to the base layer element. The method also comprises encapsulating the base layer element and the die with a molding compound. The molding compound encapsulates the base layer element and the lateral sides of the die whereby a substantially planar surface is formed comprising the second surface of the die and an upper surface of the molding compound.

BRIEF DESCRIPTION OF THE DRAWINGS

These and other features, aspects, and advantages of the present invention become better understood with reference to the following description, amended claims, and accompanying drawings, which should not be read to limit the invention in anyway, in which:

FIG. 2 is a cross-section of a BGA package according to a first exemplary embodiment of the present invention and FIG. 2A is an alternative embodiment using a thermal grease.

DETAILED DESCRIPTION OF THE INVENTION

The present invention will be explained in further detail with reference to the accompanying drawings.

Figure 1A:
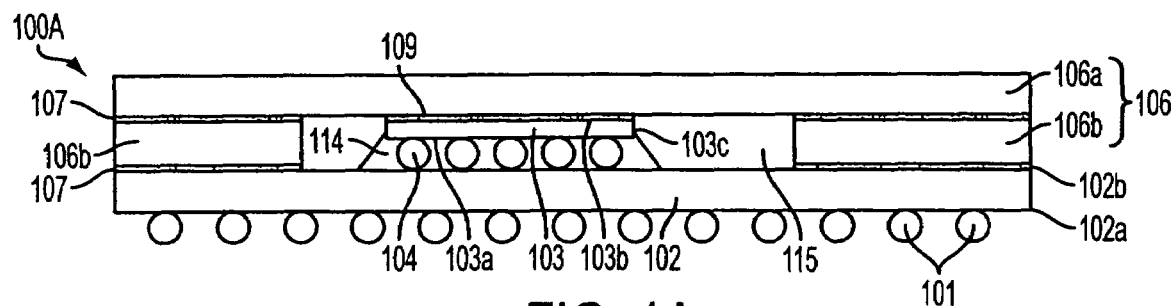
FIG. 1A is a cross-section of a conventional high performance flip chip BGA package with a two-piece heat spreader.
Figure 1B:
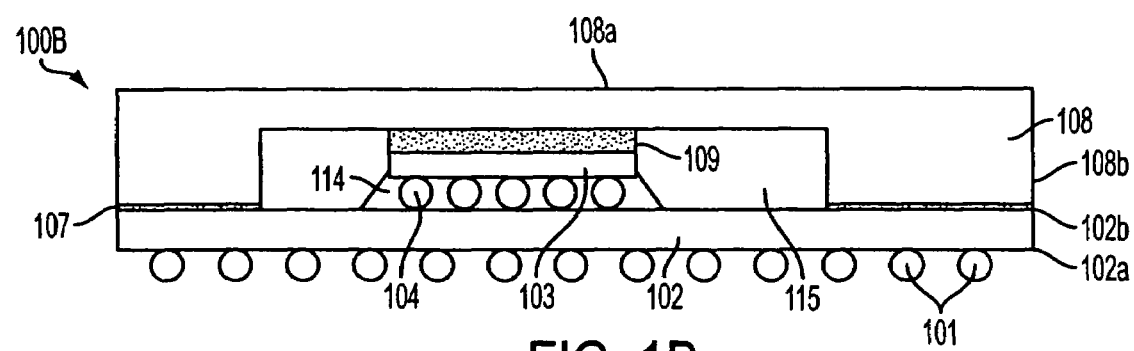
FIG. 1B is a cross-section of a conventional high-performance flip chip BGA package with a one-piece heat spreader.
Figure 2:
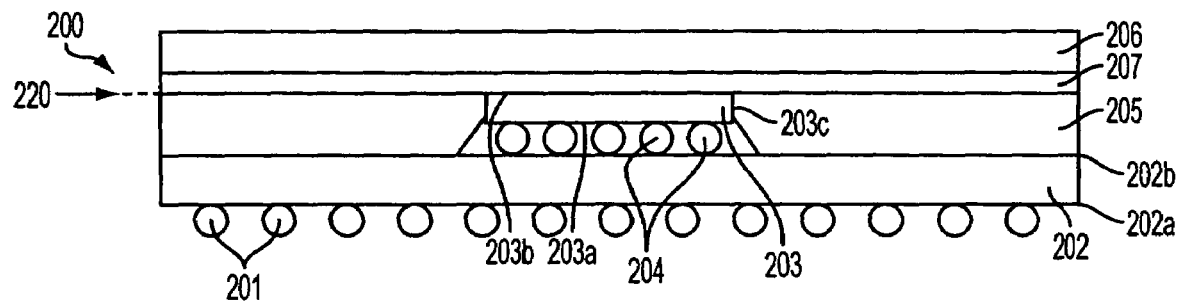

A cross-section of a BGA package 200 according to a first exemplary embodiment of the present invention is illustrated in FIG. 2. The BGA package 200 comprises a base layer element 202. The base layer element can be coupled to a circuit board (not shown) through solder balls 201. The base layer element 202 has a first surface 202a, to which a flip chip die 203 is attached, and a second surface 202b opposite to the first surface 202a. The base layer element 202 can have a plurality of layers (not shown), as would be understood by one of skill in the art. The layers can include a first metal layer on the first surface of the base layer element and a second metal layer on the second surface of the base layer element 202. Additional layers can be provided between the first and second metal layers. All of the layers can be patterned as would be understood by one of skill in the art. As would also be understood by one of skill in the art, certain layers can be used to provide signaling, while others can be used to provide ground and power connections to the flip chip die 203. The base layer element 202 can have either a ceramic or organic composition, such as an epoxy-glass resin, or may comprise a variety of other materials as would be understood by one of ordinary skill in the art.

A conductive pattern (not shown) on the first surface 202a of the base layer element 202 may be formed with electrodes (not shown), which may be formed selectively or in the form of a grid array.

As shown in FIG. 2, a flip chip die 203 has a first surface 203a, a second surface 203b opposite to the first surface 203a, and a plurality of lateral sides 203c. The flip chip die 203 is attached to the second surface 202b of the base layer element 202 by a plurality of electrically conductive adhesive flip chip bumps 204 that are formed on the first surface 203a of the flip chip die 203. An underfill epoxy 214 surrounds the flip chip bumps 204 and further secures the flip chip die 203 to the base layer element 202. The underfill epoxy 214 strengthens the package helping to prevent shock or vibration from causing the electrical connections between the flip chip die 203 and the base layer element 202 to sever. The underfill epoxy 214 also protects the connection from moisture and contamination.

A molding compound 205 encapsulates the second surface 202b of the base layer element 202, the underfill epoxy 214, and the plurality of lateral sides 203c of the flip chip die 203. As an alternative to the use of a separate underfill epoxy, and as would be understood by one of skill in the art, a molding compound that is adapted to flow easily can be applied directly around the flip chip die 203, such that the molding compound serves as both an underfill and an encapsulant. This alternative allows the underfill and the encapsulant to be applied in a single step. The molding compound 205 can be, but is not necessarily a thermoplastic molding resin with a thermal conductivity in the range of about 10-20 W/mK, which is almost ten to twenty times higher than that of conventional thermoset molding resins. The molding compound 205 can also be a thermoset material and can be cured by either thermal or chemical activation or any conventional molding compound, including thermally conductive and non conductive materials, as would be understood by one of skill in the art. As shown in FIG. 2, the molding compound 205 does not contact the second surface 203b of the flip chip die 203. A substantially planar surface 220 is formed comprising the second surface 203b of the flip chip die and an upper surface of the molding compound 205.

Figure 3:
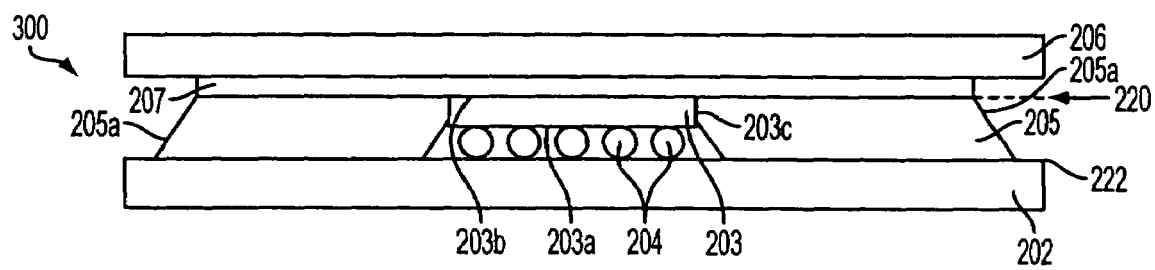
FIG. 3 is a cross-section of an aspect of a BGA package according to the first exemplary embodiment of the present invention.

As shown in FIG. 3, an alternate exemplary embodiment of the ball grid array package 300 that uses a flip chip die 203 leaves tapered edges 205a formed from the molding compound 205. The tapered edges 205a leave a portion 202c of the second surface 202b of the base layer element 202 free from molding compound 205. This portion 202c can be clamped during the molding process. The tapered edges 205a also help relieve any stress put on the corner 222 of the BGA package. The tapered edges 205a, shown in FIGS. 4-9 described below, can be straight, as shown in FIG. 2, or tapered, as shown in FIG. 3, or may have other shapes, as would be understood by one of skill in the art.

As further shown in FIG. 2, an adhesive material 207 is disposed on the substantially planar surface 220 comprising the second surface 203b of the flip chip die 203 and an upper surface of the molding compound 205. The adhesive material 207 serves as an interface between the flip chip die 203 and a heat spreader 206. In an alternative embodiment, as illustrated in FIG. 2A and as would be understood by one skilled in the art, some or all of the surface of the flip chip die 203 may be coated by a thermal grease 209 in order to provide a non-adhesive heat conductive interface to the spreader 206. In either case, the heat spreader 206 has a simple substantially planar design and can be made of any of a variety of materials, as would be understood by one of ordinary skill in the art, and are intended to be encompassed here. Advantageously, the one-piece design for the heat spreader 206 enables the use of low-cost photo-etching or stamping technologies to form the heat spreader 206. Unlike with the conventional designs discussed above, a heat spreader 206, according to an aspect of the first exemplary embodiment is independent of the die size. The conventional heat spreader designs discussed above limit the size of the die that can fit into the package due to the presence of a ring shaped piece or side walls. The heat spreader 206 can be easily attached to the BGA package by an interface material (not shown).

Figure 4:
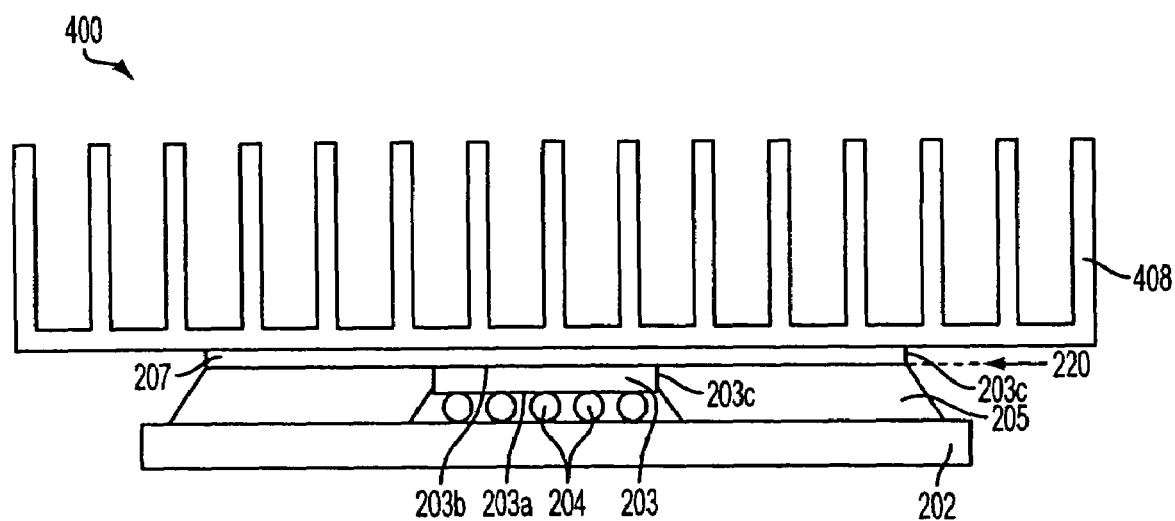
FIG. 4 is a cross-section of an aspect of a BGA package according to the first exemplary embodiment of the present invention comprising a system-level heat sink.

As shown in FIG. 4, one aspect of the first exemplary embodiment of the present invention comprises a system level heat sink 408. The system level heat sink 408 is much larger than the surface of an individual flip chip die 203, and is mounted directly onto the BGA package 400. The system level heat sink 408 is adapted to be coupled to, and to remove heat from, a plurality of integrated circuit packages, including BGA packages. The system level heat sink 408 dissipates heat and implements a cooling element via a system fan (not shown). The system level heat sink 408 can act in lieu of the one-piece heat spreader 206 shown in FIGS. 2 and 3, and can be used to achieve the required thermal performance at a system level.

Figure 5:
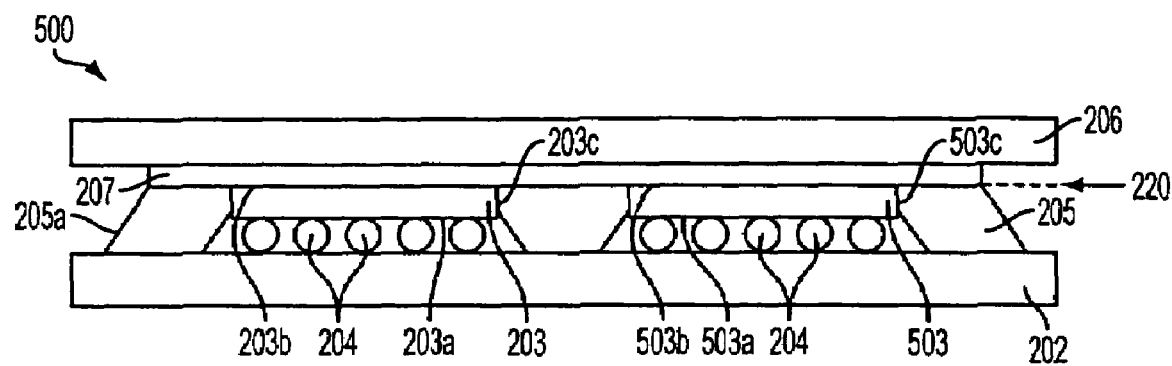
FIG. 5 is a cross-section of an aspect of a BGA package according to the first exemplary embodiment of the present invention comprising an additional flip chip die.
Figure 6:
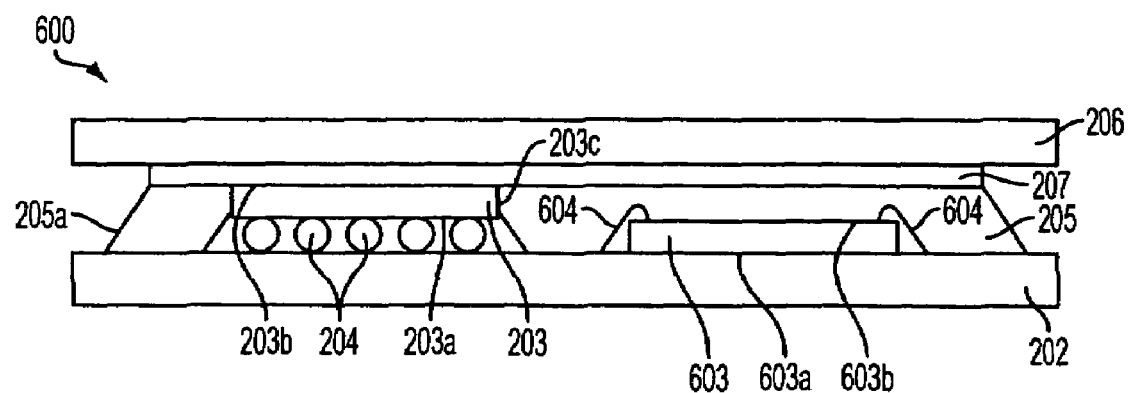
FIG. 6 is a cross-section of an aspect of a BGA package according to the first exemplary embodiment of the present invention comprising a wire bonded die.
Figure 7:
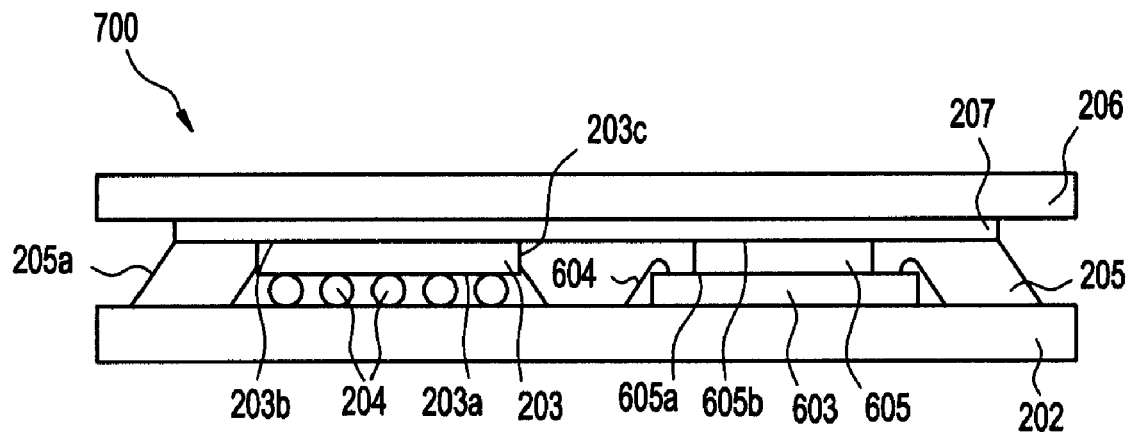
FIG. 7 is a cross-section of an aspect of the BGA package shown in FIG. 6 further comprising a heat transfer element.

Further aspects of the first exemplary embodiment of the present invention incorporate multiple chips into a BGA package design, as shown in FIGS. 5-7.

As shown in FIG. 5, a BGA package 500 according to the first exemplary embodiment of the present invention can comprise at least one additional flip chip die 503. The additional flip chip die is mounted similarly to the first flip chip die 203 discussed above. The molding compound 205 also encapsulates the additional flip chip die 503, and the substantially planar surface 220 is further comprised of the second surface 503b of the additional flip chip die 503.

As shown in FIG. 6, a BGA package 600 according to another aspect of the first exemplary embodiment can comprise at least one wire bonded die 603 mounted on the base layer element 202. The second surface 603b of the wire bonded die 603 is electrically joined to the base layer element 202 through a plurality of wires 604. The plurality of wires 604 can be composed of gold, aluminum, or copper, for example. The two dies 203 and 603 are encapsulated by the molding compound 205 that protects the wire bonded die 603 and the plurality of wires 604 from external elements. The molding compound 205 again forms a substantially planar surface 220 comprising the second surface 203b of the flip chip die 203 and an upper surface of the molding compound 205. As described above, an adhesive material 207 is disposed on the substantially planar surface 220 and a heat spreader 206, is affixed to the adhesive material 207. As with the alternative (but not illustrated) embodiment mentioned with respect to FIG. 2, some or all of the interface between the flip chip die 203 and the heat spreader may be coated solely with a non-adhesive thermal grease. In either case, the wire bonded die 603 is not necessarily directly coupled to the heat spreader 206, but may have the molding compound 205 disposed there between.

As shown in FIG. 7 and according to another aspect of the first exemplary embodiment, a heat transfer element 605 can also be mounted between the second surface 603b of the wire bonded die and the adhesive material 207. The heat transfer element can be a dummy die, a conductive metal plate, or the like. The heat transfer element 605 has a first surface 605a mounted on the second surface 603b of the wire bonded die 603. The substantially planar surface 220 on which the thermal conductive material 207 is disposed further comprises a second surface 605b of the heat transfer element 605. The heat transfer element 605 can thereby facilitate the dissipation of heat from the wire bonded die 603, provide additional support to the BGA package 700, and provide protection for the wires 604.

Figure 8:
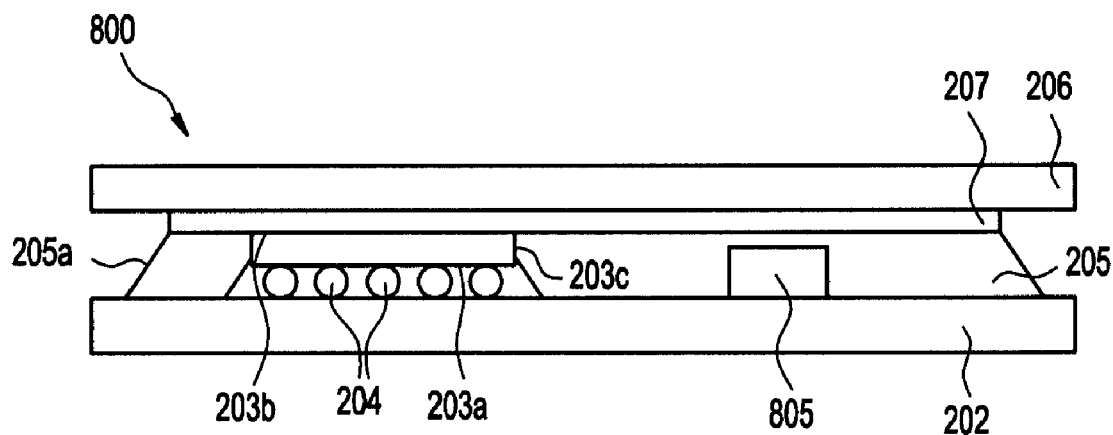
FIG. 8 is a cross-section of an aspect of a BGA package according to the first exemplary embodiment of the present invention comprising a secondary component.

FIG. 8 illustrates another aspect of the first exemplary embodiment. According to this aspect, the BGA package 800 further comprises one or preferably more supplemental components 805. Such supplemental components 805 are mounted on the base layer element 202. The supplemental components 805 may be shorter than the combined height of the flip chip die 203 and the bumps 204, as shown in FIG. 8. Alternatively, the supplemental components 805 may be taller than the combined height of the flip chip die 203 and the bumps 204. In this case, a conductive metal plate (not shown) may be mounted on the first surface of the flip chip die 203 so that the combined height of the flip chip die 203, the bumps 204, and the metal plate is about that of the supplemental components 805. The supplemental components 805 can be passive components, such as resistors, inductors, capacitors, or any other appropriate elements useful for integration into a protected package of the type illustrated, where the full utilization of the substrate real estate is desired, as would be understood by one of skill in the art. Accordingly, passive components or the like can be added to any of the embodiments illustrated in other figures herein.

Figure 9:
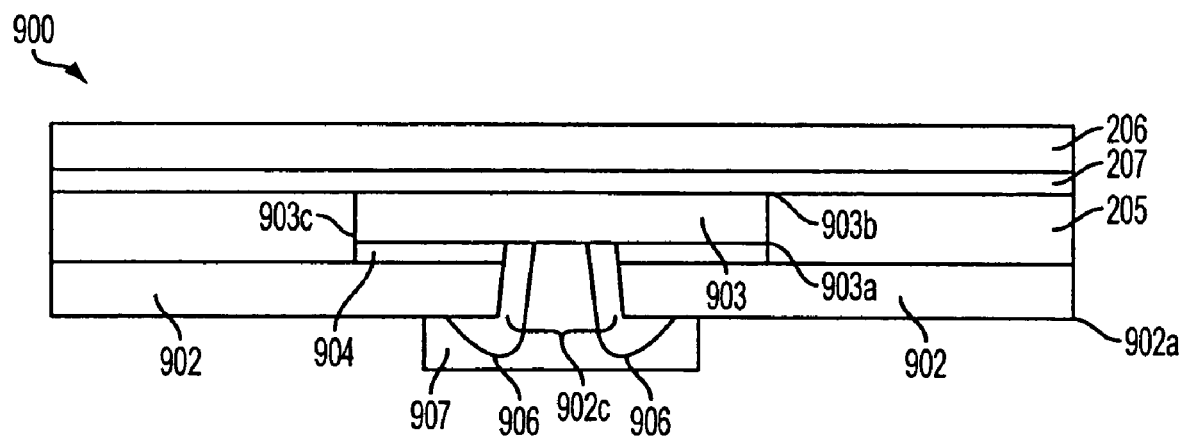
FIG. 9 is a cross-section of a BGA package according to the second exemplary embodiment of the present invention.

FIG. 9 illustrates a BGA package 500 according to a second exemplary embodiment of the present invention. The BGA package 900 comprises a base layer element 902. A wire bonded die 903 is mounted on the base layer element 902 in a die down configuration. The first surface 903a of the wire bonded die 903 is mounted to the base layer element 902 through an adhesive layer 904. A plurality of wires 906 electrically join the first surface 903a of the wire bonded die 903 to the first surface 902a of the base layer element 902. The plurality of wires 906 are joined to the first surface 903a of the wire bonded die 903 and pass through a hole 902c in the base layer element 902. The wires 906 can be composed of gold, aluminum, or copper, for example. An encapsulant 907 fills the hole 902c in the base layer element 902 and surrounds and protects the wires 906.

Hereinafter, the elements discussed with respect to the following embodiments and aspects are similar to those discussed with respect to the aforementioned embodiments and aspects and may comprise the same materials and constructions as discussed above. Exemplary reference will be made to the Figures as described above.

According to a third exemplary embodiment of the present invention, and with reference to FIG. 3, a method of assembling a BGA package comprises providing a base layer element 202 and a flip chip die 203. Flip chip bumps 204 may be pre-attached to the flip chip die 203. The flip chip die 203 is mechanically mounted or attached to the second surface 202b of the base layer element 202 by a conductive adhesive (not shown) coated on the flip chip bumps 204. The assembled base layer element 202 and flip chip die 203 is subjected to a solder re-flow process that electrically and mechanically joins the base layer element 202 to the flip chip die 203. An underfill epoxy 214 is then applied to further secure the flip chip die 203 to the base layer element 202 and to protect the electrical connection of the flip chip bumps 204. The underfill epoxy 214 is dispensed at one or more sides of the gap between the flip chip 203 and the base layer element 202 and flows by capillary action until it fills the gap and makes contact with each of the flip chip bumps 204. A low viscosity underfill epoxy can be used to flow into the gap quickly enough to allow for high-speed production.

A molding compound 205 is then applied over the base layer element 202 and around the sides of the underfill epoxy 214 and the sides 203c of the flip chip die. Thereby a substantially planar surface 220 is formed comprising the second surface 203b of the flip chip die 203 and an upper surface of the molding compound 205. As discussed above, and as would be understood by one of skill in the art, the use of a separate underfill epoxy 214 can be avoided entirely by directly applying the molding compound 205 around the flip chip die 203. The thermal molding compound 205 is quick-setting so that it may cure in a short time for high production output. The molding compound can be cured by thermal or chemical activation.

A material 207 is then applied to the substantially planar surface 220 formed by the second surface 203b of the flip chip die 203 and an upper surface of the molding compound 205. A thermal dissipation element, which can be a heat spreader 206 or a system level heat sink 408 can then be mounted to the BGA package 200 via the material 207.

As would be understood by one skilled in the art, the present invention allows achievement of maximum board utilization since a greater amount of substrate area is available for multiple chips and passives in a single package.

A further advantage is the ability to use thin substrates for better electrical performance. Thin substrates that are known to provide better electrical performance due to shorter interconnections through the substrate, are very difficult to handle during the assembly processes, especially after chip attach. With the molding compound covering the top of the thin substrate, the entire structure becomes rigid, thus improving its ease in handling.

Yet another important advantage is better reliability of board level solder joints. Solder joint reliability can be enhanced due to the removal of direct interaction of heat spreader with the substrate.

Further, with the present invention, the heat spreader design becomes independent of the size, and allows achievement of a low cost one-piece heat spreader design with high thermal performance.

Although the above exemplary embodiments and advantages of the present invention have been described, it will be understood by those skilled in the art and that the present invention should not be limited to the described exemplary embodiments, but that various changes and modifications can be made within the spirit and scope of the present invention. Accordingly, the scope of the present invention is not limited to the described range of the following claims.

What is claimed is:

1. A ball grid array package comprising:
   a base layer element;
   a flip chip die mounted on said base layer element, wherein said flip chip die comprises:
      a first surface electrically, conductively coupled to said base layer element,
      a second surface opposite to first surface, and
      a plurality of lateral sides; and
   a molding compound encapsulating said base layer element and said lateral sides of said flip chip die, whereby a substantially planar surface is formed comprising said second surface of said flip chip die and an upper surface of said molding compound;
   wherein said molding compound forms lateral edges spaced apart from said flip chip die tapering upward and inward from said base layer element to said upper surface of said molding compound which forms part of said substantially planar surface.

2. The ball grid array package according to claim 1, further comprising:
   an adhesive material disposed on said substantially planar surface; and
   a heat spreader mounted on said and adhesive material.

3. The ball grid array package according to claim 1, further comprising:
   a supplemental component mounted on said base layer element, wherein said molding compound further encapsulates said supplemental component.

4. The ball grid array package according to claim 3, wherein said supplemental component comprises:
   at least one passive component.

5. The ball grid array package according to claim 1, further comprising:
   a material disposed on said substantially planar surface; and
   a heat sink mounted on said material.

6. The ball grid array package according to claim 1, further comprising:
   at least one additional flip chip die mounted on said base layer element, wherein said at least one additional flip chip die comprises:
      a first surface electrically coupled to said base layer element,
      a second surface opposite to said first surface, and
      a plurality of lateral sides;
   wherein said molding compound further encapsulates said lateral sides of said at least one additional flip chip die;
   wherein said substantially planar surface further comprises said first surface of said at least one additional flip chip die; and
   wherein said molding compound forms lateral edges spaced apart from said flip chip dies tapering upward and inward from said base layer element to said upper surface of said molding compound which forms part of said substantially planar surface.

7. The ball grid array package according to claim 6, further comprising:
   an adhesive material disposed on said substantially planar surface; and
   a heat spreader mounted on said adhesive material.

8. The ball grid array package according to claim 6 further comprising:
   a supplemental component mounted on said base layer element, wherein said molding compound further encapsulates said supplemental component.

9. The ball grid array package according to claim 8 wherein said supplemental component comprises:
   at least one passive component.

10. The ball grid array package according to claim 1, further comprising:
    at least one wire bonded die comprising:
       a first surface mounted on said base layer element,
       a second surface opposite to said first surface, and
       a plurality of wires electrically joining said second surface of said wire bonded die to said base layer element;
    wherein said molding compound, further encapsulates said wire bonded die and said plurality of wires.

11. The ball grid array package according to claim 10, further comprising:
an adhesive material disposed on said substantially planar surface; and
a heat spreader mounted on said and adhesive material.

12. The ball grid array package according to claim 10 further comprising:
a supplemental component mounted on said base layer element, wherein said molding compound further encapsulates said supplemental component.

13. The ball grid array package according to claim 12 wherein said supplemental component comprises:
at least one passive component.

14. The ball grid array package according to claim 10 further comprising:
a heat transfer element comprising
a first surface mounted on said second surface of said wire bonded die,
a second surface opposite to said first surface, and
a plurality of lateral sides,
wherein said molding compound further encapsulates said lateral sides of said heat transfer element;
an adhesive material disposed on said substantially planar surface; and
a heat spreader mounted on said and adhesive material.

15. The ball grid array package according to claim 14, wherein said heat transfer element is a dummy die.

16. The ball grid array package according to claim 14, wherein said heat transfer element is a metal plate.

17. A ball grid array package comprising:
a base later element;
a wire bonded die mounted in a die down configuration on said base layer element, wherein said wire bonded die comprises:
a first surface mounted on said base layer element,
a second surface,
a plurality of lateral sides, and
a wire bond electrically coupling said first surface of said wire bonded die to said base layer element; and
a molding compound encapsulating said base layer element and said plurality of lateral sides of said wire bonded die, whereby a substantially planar surface is formed comprising said second surface of said wire bonded die and an upper surface of said molding compound;
wherein said molding compound forms lateral edges spaced apart from said wire bonded die tapering upward and inward from said base layer element to said upper surface of said molding compound which forms part of said substantially planar surface.

18. The ball grid array package according to claim 17, further comprising:
an adhesive material disposed on said substantially planar surface; and
a heat spreader mounted on said adhesive material.

19. A method of assembling a ball grid array package comprising:
providing a base layer element and at least one flip chip die, said flip chip die comprising a first surface, a second surface opposite to said first surface, and a plurality of lateral sides;
mounting said at least one flip chip die on said base layer element, whereby said first surface is electrically conductively joined to said base layer element;
encapsulating said base layer element and said at least one flip chip die with a molding compound, whereby said molding compound encapsulates base layer element and said lateral sides of said at least one flip chip die and whereby a substantially planar surface is formed comprising said second surface of said at least one flip chip die and an upper surface of said molding compound;
disposing an adhesive layer on at least a portion of said substantially planar surface; and
mounting a one-piece heat spreader on said adhesive layer;
wherein said molding compound forms lateral edges spaced apart from said at least one flip chip die tapering upward and inward from said base layer element to said upper surface of said molding compound which forms part of said substantially planar surface.

20. The method according to claim 19 further comprising disposing a non-adhesive layer on at least a portion of said substantially planar surface comprising a portion of said second surface of said at least one flip chip die.

21. The method according to claim 19 further comprising:
providing at least one wire bonded die having a first surface mounted on a base layer element, a second surface opposite to said first surface and a plurality of wires electrically joining said second surface of said wire bonded die to said base layer element; and
said encapsulating step further includes encapsulating said wire bonded die and the plurality of wires with said molding compound.

22. The method according to claim 19 further comprising:
providing at least one wire bonded die mounted in a die down configuration on said base layer element, the wire bonded die having a first surface mounted on said base layer element, a second surface, a plurality of lateral sides, and a wire bond electrically coupling said first surface of said wire bonded die to said base layer element; and
wherein said encapsulating step further comprises encapsulating said base layer element and said plurality of lateral sides of said wire bonded die with said molding compound, whereby a substantially planar surface is formed comprising said second surface of the wire bonded die and an upper surface of the molding compound.

23. The method according to claim 21 further comprising molding said molding compound to form lateral edges spaced apart from said wire bonded die tapering upward and inward from base layer element to said upper surface of said molding compound which forms part of said substantially planar surface.

24. The method according to claim 22 further comprising molding said molding compound to form lateral edges spaced apart from said wire bonded die tapering upward and inward from said base layer element to said upper surface of said molding compound which forms part of said substantially planar surface.

* * * * *